Nov. 25, 1969 J. N. MANDALAKAS 3,480,781

TEMPERATURE COMPENSATED SOLAR CELL LIGHT SENSOR

Filed Sept. 15, 1967 2 Sheets-Sheet 1

WITNESSES:
Leon M. Garman
James F. Young

INVENTOR
John N. Mandalakas
BY Ernest P. Klipfel
ATTORNEY

United States Patent Office
3,480,781
Patented Nov. 25, 1969

3,480,781
TEMPERATURE COMPENSATED SOLAR CELL LIGHT SENSOR

John N. Mandalakas, Greensburg, Pa., assignor to Westinghouse Electric Corporation, Pittsburgh, Pa., a corporation of Pennsylvania Filed Sept. 15, 1967, Ser. No. 668,056
Int. Cl. H01j *39/12*
U.S. Cl. 250—209 9 Claims

ABSTRACT OF THE DISCLOSURE

A temperature compensated solar cell light sensor wherein two solar cells of substantially identical characteristics are mounted on a thermal equalizing plate with a temperature sensitive resistor. The cells and the resistor are exposed to the same light and temperature conditions. In order to obtain precise measurements of the light intensity, temperature compensation of the light sensor is obtained by subtracting a temperature dependent part of the output of one cell from the entire output of the other. The temperature sensitive resistor, in close thermal contact with the thermal equalizing plate permits compensation in a suitable circuit. One such suitable circuit includes an emitter follower configuration controlled by an operational amplifier to maintain substantially short-circuit conditions across each solar cell.

BACKGROUND OF THE INVENTION

Field of the invention

The present invention relates generally to light sensors and more particularly relates to the temperature compensated solar cell light sensor.

Description of the prior art

Solar cells, which are otherwise most satisfactory light sensors, have a temperature coefficient too large to ignore in precise applications. The variance in output of a solar cell resulting from temperature change can give incorrect indications of the intensity of light impinging upon the solar cell. Such faulty indications of the light intensity result from variations of the mobilities of charge carriers within the cell due to the temperature of the cell rather than the intensity of light impinging thereon.

An object of the present invention is to provide a light sensor which will measure the intensity of a light source at a high speed and with temperature compensation.

Another object of the present invention is to provide a precise, sensitive, linear and temperature compensated light sensor to either measure or control the intensity of a light source.

Another object of the present invention is to provide a temperature compensated solar cell light sensor capable of compensating for temperature at any intensity without any necessary adjustment of circuit parameters.

SUMMARY OF THE INVENTION

Briefly, the present invention accomplishes the above cited objects by providing two solar cells made of identical material and a temperature sensitive resistor physically located so as to be subject to the same light intensity. Due to their physical location and construction, the temperature of both cells is for all practical purposes the same. Output variations of one cell caused by temperature effects are exactly cancelled out by the other cell. For good linearity of output with intensity, both solar cells are operated under short-circuit conditions. A nulling circuit can be advantageously utilized to obtain high resolution read-out by a precision multi-turn potentiometer.

BRIEF DESCRIPTION OF THE DRAWINGS

Further objects and advantages of the present invention will be readily apparent from the following detailed description taken in conjunction with the drawing in which.

DESCRIPTION OF THE PREFERRED EMBODIMENT

Figure 1:
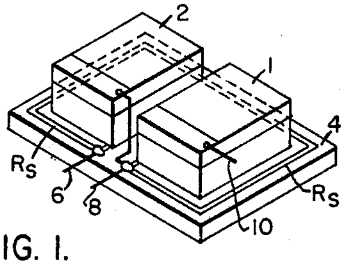
FIGURE 1 is an isometric projection of an illustrative embodiment of the present invention.

Referring to FIG. 1, a first solar cell 1 and a second solar cell 2 are mounted on a thermal equalizing plate 4 along with a temperature sensitive resistor $R_S$. Lead connections 6, 8 and 10 are brought out from the configuration for electrical connection to other circuitry. For purposes of clarity, the electrical circuit equivalent shown in FIG. 2 has been assigned like-reference characters.

Figure 2:
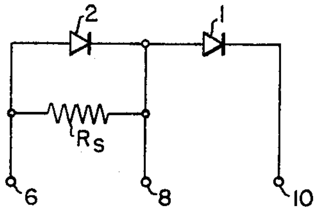
FIG. 2 is an electrical schematic diagram of the embodiment shown in FIG. 1.

The solar cells 1 and 2 shown in FIGS. 1 and 2 are made of the same material with identical physical and electrical characteristics. The cells and the compensating resistor $R_S$ are positioned on the thermal equalizing plate 4 and situated in such a way that they are to be exposed to the same light and temperature conditions. If the cells 1 and 2 are at the same temperature and exposed to the same light intensity, compensation can be achieved by subtracting a temperature dependent part of the output of the second cell 2 from the entire output of the other cell 1. The arrangement illustrated in FIGS. 1 and 2 has the temperature sensitive resistors $R_s$ in close thermal contact with the heat sink 4 to thereby be at the same temperature as the cells 1 and 2. The illustrated arrangement permits compensation in a suitable circuit such as that of FIG. 4.

Figure 3:
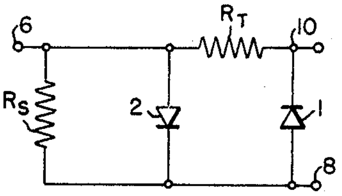
FIG. 3 is an electrical schematic diagram of an illustrative embodiment of the present invention.

For good linearity of output with intensity, a solar cell must operate under short-circuit conditions. Such short-circuit conditions are provided for the solar cell 1 by means of the circuity of FIG. 4, to be discussed in greater detail hereinafter. From FIG. 3 however it can be seen that should the cell 2 have zero voltage thereacross, no current would flow through the temperature sensitive resistor $R_S$ no matter how small its magnitude. Hence, a fixed resistor $R_T$ is inserted between the cells 1 and 2 to insure the diverting of a proper amount of current through the temperature sensitive resistor $R_S$. The amount of current so diverted will be determined by the ratio of magnitudes of the resistors $R_T$ and $R_S$.

Figure 4:
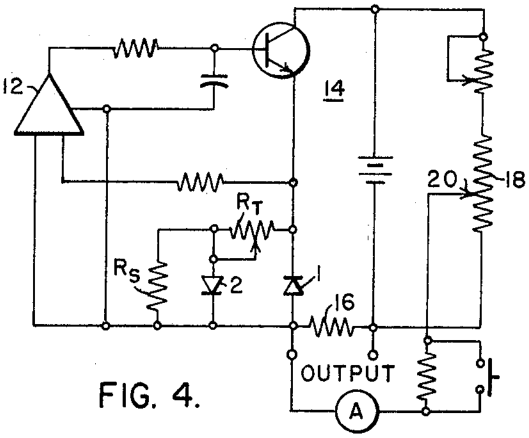
FIG. 4 is an electrical schematic diagram of electronic circuitry utilizing the illustrative embodiment of FIG. 3.

In order to provide short-circuit conditions across the solar cell 1, the circuitry of FIG. 4 is employed. An operational amplifier 12 is connected across the first cell 1 to drive the emitter follower circuit 14 to maintain zero voltage across the first cell 1. Since the resistors $R_T$ and $R_S$ are each only a few ohms, the second cell which provides temperature compensation is also practically short-circuited. A portion of the output current from the temperature compensation cell 2 is partially diverted through the compensating resistor $R_S$ and partially through the current generating cell 1 to cancel the component of output from generating cell 1 which is temperature dependent. The remainder of the current generated by the first cell 1 is then a true indication of the intensity of light being received by the light sensor. A load resistor 16 is inserted in the emitter follower circuit 14 to provide an output voltage in accordance with the intensity so received. To exploit the full accuracy potential of the temperature compensated light sensor, a precision multi-turn potentiometer 18 is connected with its sliding tap 20 positioned to balance out the potential appearing across the load resistor 16. When the null detector is balanced, the dial of the precision multi-turn potentiometer 18 can be read to three figures.

Figure 5:
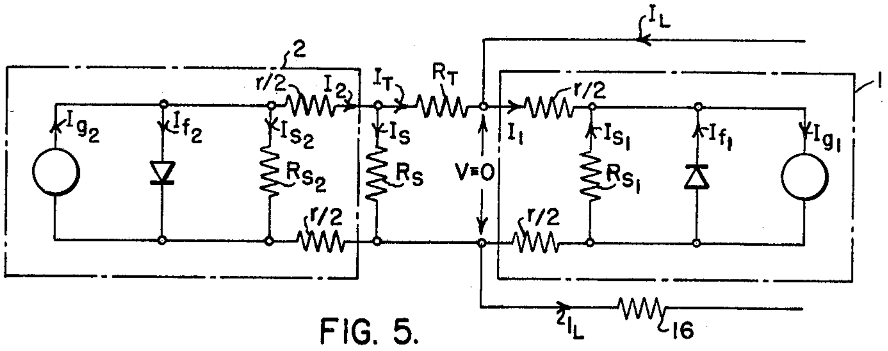
FIG. 5 is an electrical equivalent circuit of the circuitry of FIG. 3.

An analysis of the obtained compensation can be derived from the equivalent circuit of FIG. 5. It can be seen from the equivalent circuit of FIG. 5 that $$I_T = I_2\left[\frac{R_S}{R_S+R_T}\right] \quad (1)$$

and also that, since $V=0$ across the first or current generating cell 1.

$$I_L = I_1 - I_T \quad (2)$$

If the two cells are assumed identical, making $I_1=I_2$, then $$I_L = \frac{R_T}{R_T+R_S} I_1 \quad (3)$$

Figure 6:
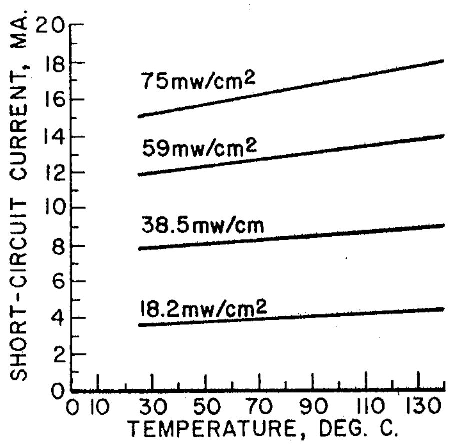
FIG. 6 is a graphical representation of temperature dependence of a single cell utilized in the illustrative embodiment.

$I_1$ can be readily determined from simply measuring the short circuit current of a single cell in response to temperature. Such measurements have been obtained and seen to be linear as illustrated in FIG. 6. FIG. 6 is an *xy* recording showing temperature dependents of a single cell to be a straight line. Hence, $I_1$ is seen from FIG. 6 to have the form $$I_{1T} = I_{25}[1+\alpha(25)] \quad (4)$$

whence $$I_L = \frac{R_T}{R_T+R_S} I_{25}[1+\alpha(T-25)] \quad (5)$$

Since the current through the load $I_L$ is to be independent of temperature, the derivative of the load current $I_L$ with respect to temperature is made equal to zero. The simplified result is $$\frac{R_T+R_S}{R_T} = C_1[1+\alpha(T-25)] \quad (6)$$

Substituting this value for $(R_T+R_S)/R_T$ into Equation 5 will make the load current $I_L$ independent of temperature. The resistor $R_S$ was selected as the temperature sensitive element and accordingly will have a magnitude of resistance represented by $$R_S = C[1+\alpha(T-25)] - R_T \quad (7)$$

Applying the boundary conditions $$T = 25 \text{ deg C., } C = R_{S25} + R_T$$

gives the required temperature dependence of the resistor $R_S$:

$$R_S = (R_{S25}+R_T)[1+\alpha(T-25)]R_T \quad (8)$$

Most metals possess this type of temperature dependence; copper and nickel are two examples whose resistance is given by $$R = R_0[1+\beta(T-25)]$$

If we make $R_0$ equal to $R_{S25}$, and set $$\frac{\partial R_S}{\partial T} = \frac{\partial R}{\partial T}$$

Then $$\frac{R_T}{R_{S25}} = \frac{\beta}{\alpha} - 1 \quad (9)$$

giving the ratio of $R_T$ to $R_{S25}$. The value of $\alpha$ has been experimentally found to be $$\alpha = 1.5\times10^{-3}/^\circ \text{ C.}$$

as determined from the slope of the operating curves shown in FIG. 6.

Choosing the temperature sensitive resistor $R_S$ at 25° C. to have a value of 1.5 ohms, then for copper, with $$\beta = 3.82\times10^{-3}/^\circ \text{ C.}$$
$$R_T = 2.3 \text{ ohms}$$

and for nickel, with $$\beta = 6\times10^{-3}/^\circ \text{ C.}$$
$$R_T = 4.5 \text{ ohms}$$

Nickel has two advantages over copper: (1) since the static compensating current is reduced by higher $R_T$, it will give a higher $I_L$ for the same intensity, and (2) since $\beta$ is higher, a shorter piece of wire can be used.

Figure 7:
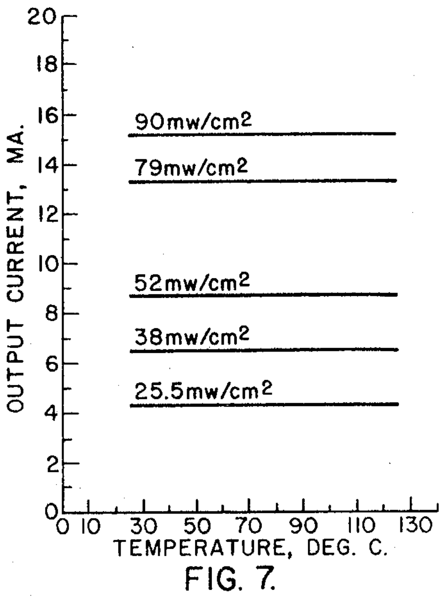
FIG. 7 is a graphical representation of the operating characteristics of a light sensor in accordance with the illustrative embodiment.
Figure 11:
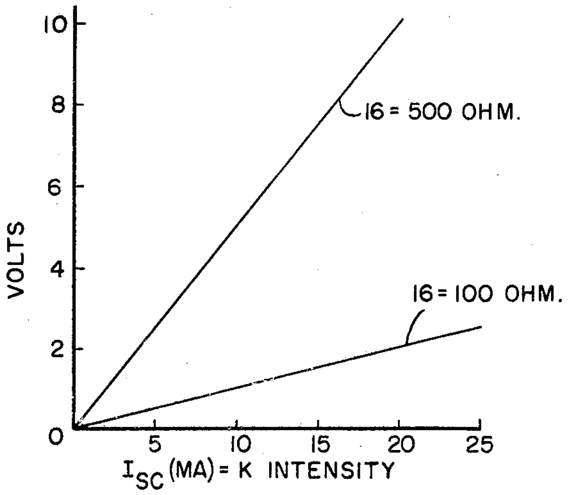
FIG. 11 is a graphical representation of output vs. intensity of the illustrative embodiment of the invention.

FIG. 7 shows that the excellent temperature compensation, ±0.00015%/° C. or better, is the same at any intensity level. Th resultant temperature compensated circuit in accordance with the present invention can be seen from FIG. 11 to provide an output versus intensity relationship which is linear to at least the third significant figure. The device's response is extremely rapid, on the order of a few microseconds. Since it is the generated current of the solar cells that is temperature compensated, the output voltage, and in turn, the sensitivity of the system, can be adjusted to any desired level.

The circuit arrangement in accordance with the present invention can be used for any application calling for either the measurement or the control of the light intensity. For example, a hot crucible can be utilized as the light source. The crucible may be part of a silicon web-pulling furnace requiring temperature sensing and control.

The microdial is adjusted until the microammeter A indicates no deflection. When this condition is achieved, the output of the system can be read directly from the microdial within three significant figures.

This provides a quick, inexpensive and accurate method of measuring the output. If, instead, the microdial is set to any desired position, the reading of the microammeter will constitute the error signal between the desired and existing intensity. Use of the error signal in a suitable feedback system will result in accurate intensity or temperature control.

The sensor's exceptional sensitivity and linearity make it ideal as an intensity meter. It may be used as an amplitude and width detector for pulses of light or as a film exposure meter. Its most rewarding use, however, is in situations where precision and high speed are essential or where thermal conditions require linear, temperature compensated equipment.

Figure 8:
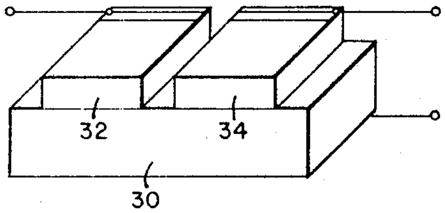
FIG. 8 is an isometric projection of an alternate device for use in an alternate illustrative embodiment of the present invention.
Figure 10:
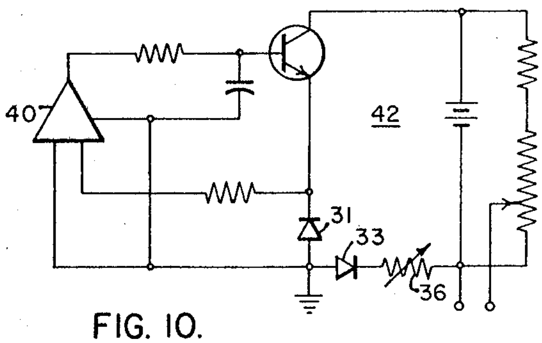
FIG. 10 is an electrical schematic diagram of an alternate illustrative embodiment of the present invention.
Figure 9:
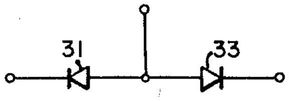
FIG. 9 is an electrical schematic diagram of the device shown in FIG. 8.

An alternate light sensor configuration is illustrated in FIG. 8. There a common anode of P material 30 has disposed thereon to separate portions of N material 32 and 34 respectively. The electrical equivalent of this configuration is illustrated in FIG. 9 wherein the first cell 31 is utilized for current generating and the second cell 33 is utilized for temperature compensation. From FIG. 10 it can be seen that an operational amplifier 40 and an emitter follower circuit 42 is again utilized to assure a perfect short-circuit condition of the generating solar cell 31. A compensating resistor 36 is serially connected with the temperature compensating cell 33. The electrical circuitry of FIG. 10 is similar to the circuitry employed in FIG. 4 except that the solar cells are voltage compensated rather than current compensated. As a result the circuitry of FIG. 10 has an inherent shortcoming in that the magnitude of the compensating resistor 36 is selected for a particular light intensity to be measured and it cannot be compensated for other light intensities without varying the magnitude of the resistor 36. Alternatively, the resistor 36 and compensating cell 33 can be replaced with an NTC thermistor positioned to be exposed to the same light and temperature conditions as the generating cell 31 to achieve temperature independence at any intensity.

While the present invention has been described with a degree of particularity for the purposes of illustration, it is to be understood that all modifications, alterations, and substitutions within the spirit and scope of the present invention are herein means to be included.

I claim as my invention:

1. In combination; first and second solar cells of substantially identical characteristics; a temperature responsive impedance means; means for exposing said cells and said impedance means to the same light and temperature conditions; circuit means for maintaining substantially zero voltage across said first cell; said temperature responsive impedance means connected to subtract the temperature dependent part of the output of said second cell from the entire output of said first cell; and output means for providing a signal responsive to the remainder of the output from said first cell.

2. The apparatus of claim 1 wherein said temperature responsive impedance means includes two resistors, one variable to fix a setpoint, the other being temperature sensitive; the ratio of the magnitudes of said two resistors determining the magnitude of that part of the output of said second cell subtracted from the entire output of said first cell.

3. The apparatus of claim 2 wherein said variable resistor to fix a setpoint is positioned away from the light and temperature conditions to which the temperature sensitive resistor is exposed.

4. The apparatus of claim 1 wherein said cells and said temperature responsive impedance means are mounted on a thermal equalizing plate.

5. The apparatus of claims 3 wherein the magnitude of each of said two resistors is chosen to substantially short-circuit said second cell.

6. The apparatus of claim 1 wherein said circuit means for maintaining zero voltage across said first cell includes operational amplifier means for sensing the potential across said first cell to provide current therethrough to maintain zero voltage thereacross.

7. The apparatus of claim 6 wherein said circuit means for maintaining zero voltage across said first cell includes an emitter follower circuit for providing an amplified current through said first cell in response to said operational amplifier means to maintain zero voltage across said first cell.

8. The apparatus of claim 7 including a precision multi-turn potentiometer connected to said emitter follower circuit; and null detector means connected between said precision multi-turn potentiometer and said output means for balancing said output voltage to the voltage across said precision multi-turn potentiometer.

9. The apparatus of claim 8 wherein said potentiometer is set to establish a reference potential thereacross to determine a temperature setpoint; and means for comparing the potential across said potentiometer establishing said setpoint with the output voltage from said output means to obtain an error signal for feedback to alter the light and temperature conditions to which said cells and said temperature responsive impedance means are exposed.

References Cited

UNITED STATES PATENTS

| | | | |
|---|---|---|---|
| 3,028,499 | 4/1962 | Farrall | 250—212 X |
| 3,286,097 | 11/1966 | Norwood | 250—209 |
| 3,311,748 | 3/1967 | Volpe et al. | 250—212 X |
| 3,427,459 | 2/1969 | Truffert | 250—212 X |
| 3,428,813 | 2/1969 | Hofmeister et al. | 250—208 X |

JAMES W. LAWRENCE, Primary Examiner

C. R. CAMPBELL, Assistant Examiner

U.S. Cl. X.R.

136—89; 250—208, 212; 315—155